United States Patent [19]

Brine

[11] 4,418,875
[45] Dec. 6, 1983

[54] THREADING TOOL

[75] Inventor: Terence J. Brine, Haslemere, England

[73] Assignee: Roadrunner Electronic Products Limited, Surry, England

[21] Appl. No.: 306,470

[22] Filed: Sep. 28, 1981

[30] Foreign Application Priority Data

Sep. 30, 1980 [GB] United Kingdom ............... 8031522

[51] Int. Cl.³ .................... H01B 13/00; B21F 15/00; B65H 49/00
[52] U.S. Cl. .................................. 242/7.06; 140/124
[58] Field of Search ................. 242/7.06, 130, 140, 242/141, 156; 57/10; 140/124, 123, 117, 52; 29/850, 751; 7/107

[56] References Cited

U.S. PATENT DOCUMENTS

| 740,654 | 10/1903 | Hochstrasser | 242/130 |
| 1,231,407 | 6/1917 | Milliorn | 140/123 |
| 2,474,463 | 6/1949 | Burrell | 140/123 |
| 2,682,063 | 6/1954 | Miloche | 242/7.06 |
| 3,913,630 | 10/1975 | Rubey | 140/123 |
| 3,967,661 | 7/1976 | Scoville et al. | 140/124 |
| 4,177,555 | 12/1979 | Weltman et al. | 140/124 |

Primary Examiner—Billy S. Taylor
Attorney, Agent, or Firm—John J. Byrne; Bradford E. Kile

[57] ABSTRACT

A threading tool intended primarily for use as an electrical wiring pencil has a tubular body housing a manually operable brake member which can be moved into frictional engagement with the edges of a rotatable spool to restrain movement of connecting wire through the body. The brake member is housed in a recessed channel which is open to the outside of the body along its entire length via a relatively narrow slot. The slot and the channel are open at the spool end of the tool to allow easy assembly of the brake member into the tool. Insertion and removal of the spool is performed by prising apart jaws at the end of the body. When inserted, the spool holds the brake member in place.

6 Claims, 6 Drawing Figures

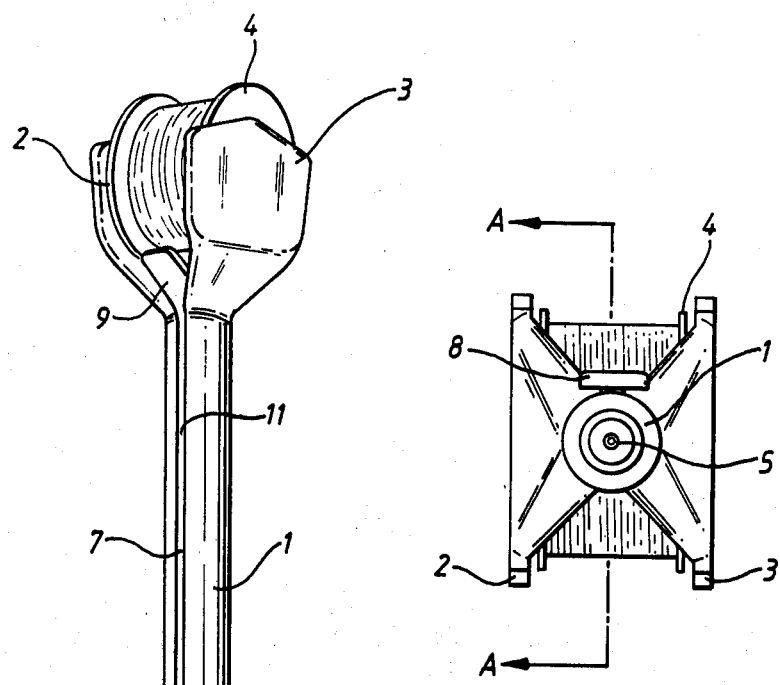
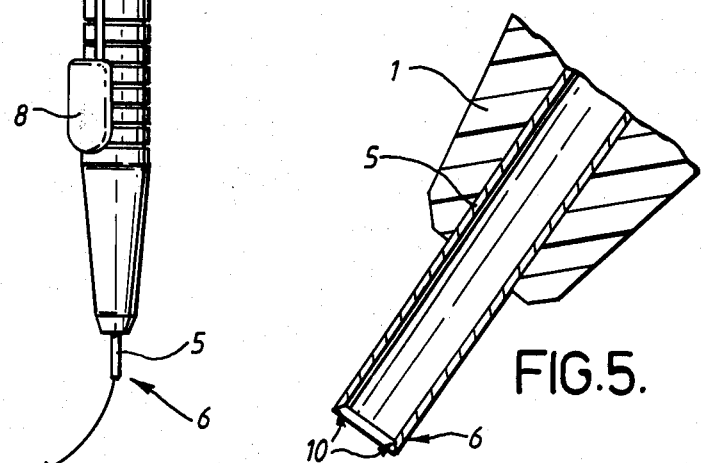
FIG.1.
FIG.2.
FIG.5.

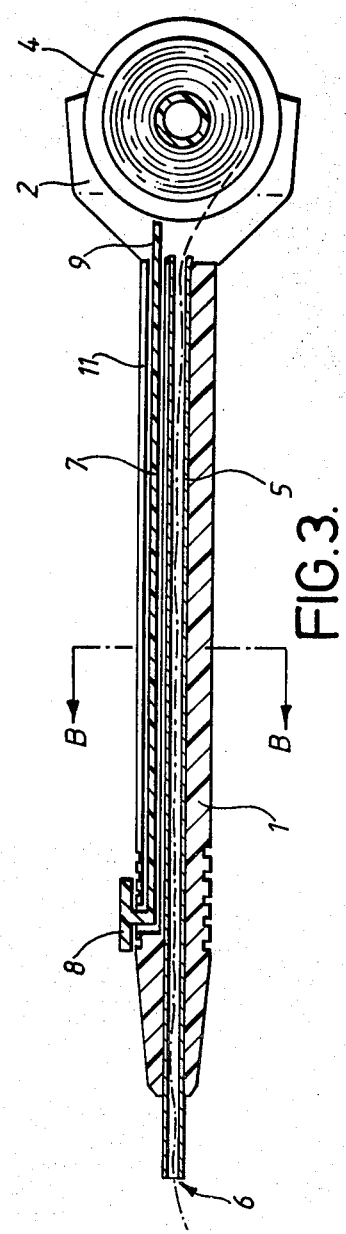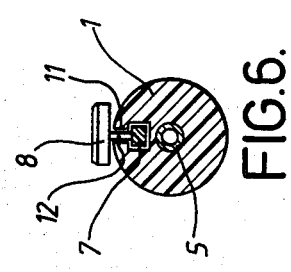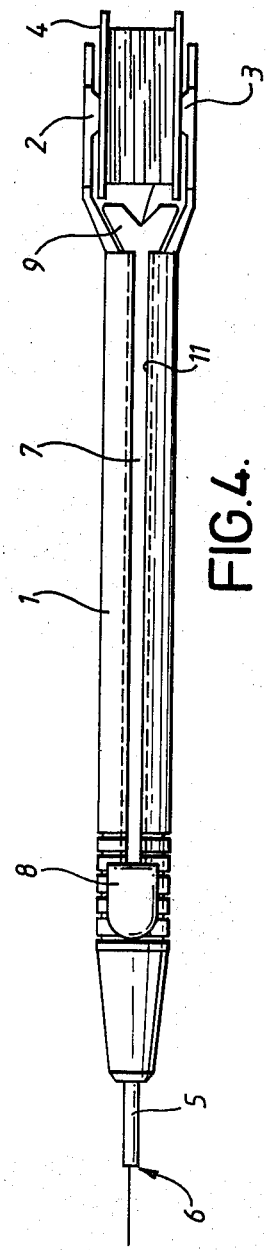

THREADING TOOL

BACKGROUND OF THE INVENTION

This invention relates to a threading tool for dispensing a filament of material for example, electrical connecting wire.

A well known hand-held wiring tool in the electronics industry is the wiring pencil. This device is conventionally pencil shaped, having a tapered wire-dispensing end and means for holding a spool of connecting wire at the other, upper end. The body of the tool is tubular so that wire from a spool rotatably mounted in the upper end can be guided through to the dispensing end where it emerges at a nozzle.

The tool can be used for stringing connecting wire between component leads on a circuit board or for making repairs to printed circuit boards. To make a connection, a length of wire protruding from the nozzle is attached by soldering or wrapping to one connection point and then the wire is drawn towards the other connection point, sufficient wire being allowed to unwind from the spool to make the second connection. The wire is cut to remove the tool from the workpiece, and the connection is soldered at each end.

It is an object of this invention to provide a threading tool which is relatively convenient in use and yet simple in construction.

SUMMARY OF THE INVENTION

According to this invention a threading tool for dispensing filament material comprises: an elongate body having an internal passageway for guiding filament material between one end of the body and a dispensing nozzle at the other end of the body; a spool rotatably mounted on the body at the said one end for holding a supply of filament material; and a manually operable brake member having a braking portion adjacent the spool, the member being movable relative to the body to a position in which the braking portion frictionally engages the spool thereby to restrain rotation of the spool.

The preferred embodiment of the invention is in the form of an electrical wiring pencil having a tubular body and a spool mounted at one end. The brake member acts against side discs of the spool and has an integral finger pad in the region of the dispensing end of the pencil where the pencil would normally be gripped by the user's fingers.

The brake member allows the user to produce tension in the connecting wire as it is threaded from one connection point on the workpiece to another. The position of the finger pad enables the tension to be controlled by the hand which is holding the tool, and makes it easier for a neat, secure, and electrically sound connection to be produced. This advantage of the tool is particularly noticed in equipment where the density of connections is high and accurate control of the wiring tool is required, for example in logic or processor equipment.

The threading tool in accordance with the invention can also be used for dispensing a filament in the form of a textile thread in applications where the thread is to be strung from one fixing point to another. An example of such an application is pin-and-thread or "string art" decorative work, in which thread or string is threaded between an array of pins on a fabric covered board.

BRIEF DESCRIPTION OF THE DRAWINGS

The invention will now be described by way of example with reference to the drawings in which:

FIG. 1 is a perspective view of a wiring pencil in accordance with the invention;

FIG. 2 is an elevation of the pencil viewed from the dispensing end;

FIG. 3 is a longitudinal section through the pencil along the line A—A in FIG. 2;

FIG. 4 is a side elevation of the pencil;

FIG. 5 is a detail section of the dispensing end; and

FIG. 6 is a section of the pencil along the line B—B in FIG. 3.

DESCRIPTION OF THE PREFERRED EMBODIMENT

Referring to FIG. 1 a wiring pencil has an elongated tubular body 1 of moulded plastics material with an integral pair of flexible jaws 2 and 3 which mount a spool 4 of connecting wire. The spool 4 can be removed by prising the jaws 2 and 3 apart and removing the spool from between pips projecting from the inner faces of the jaws. Wire from the spool 4 is threaded through an internal stainless steel tube 5 which projects from the body 1 at the tapered dispensing end of the tool to form a nozzle 6. The arrangement of the tube 5 in the body 1 is shown more clearly in FIG. 3.

The spool 4 is free to rotate between the jaws 2 and 3 as wire is drawn from the nozzle.

In accordance with the invention, a brake member 7 is mounted in a channel in the body 1. This member is slidable in the channel and has an integral finger pad 8 in the region of the dispensing end of the tool where it may be easily moved by the forefinger of the use's hand. Movement of the pad 8 towards the spool 4 causes the splayed braking portion 9 of the brake member 7 to engage the edges of the spool 4 so as to provide frictional resistance against movement of the spool and the wire. A relatively small pressure on the pad is sufficient to create significant tension in the connecting wire when wire threading, and the degree of tension is easily controlled.

Referring to FIG. 5 the nozzle 6 of the tube 5 is internally chamferred to act as a cutting edge 10. This may be used to part the wire inside the tool from the wire which has been attached to the workpiece; -an operation which normally requires the use of side cutters.

The drawings show the brake member mounted in a recessed channel in the body 1. The channel communicates with the outside of the body via a relatively narrow slot 11 so that the brake member 7 is retained in the channel, but also can be withdrawn by removing the spool 4 and sliding the brake member between the jaws 2 and 3 until the post 12 supporting the finger pad 8 emerges from the open end of the channel. When the brake member 7 has been fitted into the body, it is held in place simply by placing the spool 4 between the jaws.

Threading the tool is achieved merely by feeding filament from the spool into the tube 5 until it emerges at the nozzle. There is no need to remove the brake member.

Alternative constructions are possible in which, for example, the member 7 is housed in a closed passage, or in which the member 7 is in the form of an external sliding sleeve around the body 1.

What is claimed is:

1. A threading tool for dispensing filament material comprising an elongate body, an internal passageway extending the length of the elongate body for guiding filament material between one end of the body and the other end of the body, a dispensing nozzle at the other end of the body, the dispensing nozzle having a chamfer forming a cutting edge for the filament material, a spool for holding a supply of filament material, the spool having a pair of side discs, first means rotatably mounting said spool at said one end, a manually operable brake member extending the major part of the length of the body and having a braking portion at said one end of the body and a finger pad at said other end, and second means mounting said member for movement relative to said body from a first position in which said braking portion is out of engagement with said spool to a second position in which said braking portion frictionally engages edges of said side discs of said spool to restrain rotation of said spool, this movement being able to take place by pressure on said finger pad as filament material is dispensed and a longitudinal internal channel is formed in the body, said channel housing said brake member.

2. A threading tool according to claim 1, wherein said first means rotatably mounts in the spool about an axis extending transversely relative to the body.

3. A threading tool according to claim 1, wherein the body has a longitudinal slot which is narrower than the channel, said slot communicating the channel with the outside of the body.

4. A threading tool according to claim 1, wherein said first means comprises a pair of flexible jaws which can be flexed apart to allow removal or insertion of the spool.

5. A threading tool according to claim 1, wherein the channel is open at the said one end of the body.

6. A threading tool according to claim 1, wherein the passageway is formed by a metallic tube housed in the body and projecting from the said other end of the body to form the said nozzle.

* * * * *